United States Patent (10) Patent No.: US 7,094,505 B2
Zhang et al. (45) Date of Patent: Aug. 22, 2006

(54) PHOTOMASK ASSEMBLY AND METHOD FOR PROTECTING THE SAME FROM CONTAMINANTS GENERATED DURING A LITHOGRAPHY PROCESS

(75) Inventors: Xun Zhang, Wappingers Falls, NY (US); Joseph Stephen Gordon, Gardiner, NY (US); Janice M. Paduano, Hyde Park, NY (US); Xiaoming Chen, Austin, TX (US); Julio R. Reyes, Cedar Park, TX (US)

(73) Assignee: Toppan Photomasks, Inc., Round Rock, TX (US)

( * ) Notice: Subject to any disclaimer, the term of this patent is extended or adjusted under 35 U.S.C. 154(b) by 155 days.

(21) Appl. No.: 10/696,326

(22) Filed: Oct. 29, 2003

(65) Prior Publication Data

US 2004/0137339 A1 Jul. 15, 2004

Related U.S. Application Data

(60) Provisional application No. 60/422,010, filed on Oct. 29, 2002.

(51) Int. Cl.
*G01F 9/00* (2006.01)
(52) U.S. Cl. ........................................ 430/5
(58) Field of Classification Search ............ 430/5; 428/14; 423/210
See application file for complete search history.

(56) References Cited

U.S. PATENT DOCUMENTS

| 3,927,943 | A | 12/1975 | Pohl et al. ............ 355/132 |
| 4,032,233 | A | 6/1977 | Oscarsson et al. ....... 355/91 |
| 4,131,363 | A | 12/1978 | Shea et al. ............ 355/75 |
| 4,159,176 | A | 6/1979 | de Masi ................ 355/79 |
| 4,255,216 | A | 3/1981 | Conant et al. ......... 156/80 |
| 4,470,508 | A | 9/1984 | Yen ................... 206/334 |
| 4,536,240 | A | 8/1985 | Winn .................. 156/74 |
| 4,584,216 | A | 4/1986 | Kenworthy et al. ..... 428/38 |
| 4,657,805 | A | 4/1987 | Fukumitsu et al. ..... 428/215 |
| 4,737,387 | A | 4/1988 | Yen ................... 428/14 |
| 4,833,051 | A | 5/1989 | Imamura ............... 430/5 |
| 4,948,851 | A | 8/1990 | Squire ................ 526/247 |
| 4,973,142 | A | 11/1990 | Squire ................ 350/409 |
| 5,008,156 | A | 4/1991 | Hong .................. 428/506 |
| 5,061,024 | A | 10/1991 | Keys .................. 359/350 |
| 5,216,250 | A * | 6/1993 | Pellegrino et al. ..... 250/370.09 |
| 5,260,585 | A | 11/1993 | Tom .................. 250/573 |

(Continued)

FOREIGN PATENT DOCUMENTS

JP 04196117 7/1992

(Continued)

OTHER PUBLICATIONS

International PCT Search Report with Notification of Transmittal, PCT/US03/34485, 8 pages, Mailed Jul. 29, 2004.

(Continued)

*Primary Examiner*—S. Rosasco
(74) *Attorney, Agent, or Firm*—Baker Botts L.L.P.

(57) ABSTRACT

A photomask assembly and method for protecting the photomask assembly from contaminants generated during a lithography process are disclosed. A photomask assembly includes a pellicle assembly formed from a pellicle frame and a pellicle film coupled to a first surface of the pellicle frame. The pellicle frame further includes an inner wall and an outer wall. A photomask is coupled to a second surface of the pellicle frame opposite the pellicle film. A molecular sieve that prevents airborne molecular contaminants (AMCs) generated during a lithography process from contaminating the photomask is associated with the pellicle assembly.

34 Claims, 2 Drawing Sheets

U.S. PATENT DOCUMENTS

| | | | |
|---|---|---|---|
| 5,487,771 A | 1/1996 | Zeller | 55/523 |
| 5,723,860 A | 3/1998 | Hamada et al. | 250/239 |
| 5,856,018 A | 1/1999 | Chen et al. | 428/448 |
| 5,928,410 A | 7/1999 | Jois et al. | 95/51 |
| 6,083,577 A | 7/2000 | Nakagawa et al. | 428/14 |
| 6,103,427 A * | 8/2000 | Storm | 430/5 |
| 6,149,992 A | 11/2000 | Nakayama | 428/14 |
| 6,254,942 B1 | 7/2001 | Tanaka | 428/14 |
| 6,277,342 B1 | 8/2001 | Pearlstein et al. | 423/210 |
| 6,383,258 B1 | 5/2002 | Simmons | 95/45 |
| 6,395,066 B1 | 5/2002 | Tanihara et al. | 95/47 |
| 6,428,583 B1 | 8/2002 | Reuter | 23/301 |
| 6,433,356 B1 | 8/2002 | Cahen et al. | 257/40 |
| 6,435,586 B1 | 8/2002 | Getzschman et al. | 296/37.6 |
| 6,436,586 B1 | 8/2002 | Matsuoka et al. | 430/5 |
| 6,443,302 B1 | 9/2002 | Tanaka | 206/316.1 |
| 6,444,608 B1 | 9/2002 | Oki et al. | 502/300 |
| 6,555,079 B1 * | 4/2003 | Hoke et al. | 423/210 |
| 6,715,495 B1 | 4/2004 | Dao et al. | 134/1.1 |

FOREIGN PATENT DOCUMENTS

| | | |
|---|---|---|
| JP | 04-269752 | 9/1992 |
| JP | 10062966 | 3/1998 |
| JP | 10198021 | 7/1998 |
| JP | 2000292909 | 10/2000 |
| JP | 2001350252 | 12/2001 |
| JP | 2003-057804 | 2/2003 |
| KR | 1020040001785 | 1/2004 |
| KR | 1020050001836 | 1/2005 |
| WO | 01/59522 A1 | 8/2001 |
| WO | 2004/031855 A2 | 4/2004 |

OTHER PUBLICATIONS

Bernal, M.P. et al., "Natural Zeolites and Sepiolite as Ammonium and Ammonia Adsorbent Materials", Bioresource Technology 43 (1993) pp. 27-33.

Bernal, M.P. et al., "Application of Natural Zeolites for the Reduction of Ammonia Emissions during the Composting of Organic Wastes in a Laboratory Composting Simulator", Bioresource Technology 43 (1993) pp. 35-39.

Grayfer et al., "Protecting 248 ηm Lithography from Airborne Molecular Contamination druing Semiconductor Fabrication", Proceedings of SPIE vol. 4346 (2001). pp. 676-694. Optical Microlithography XIV.

Kinkead et al., "Targeting Gaseous Contaminants in Wafer FAbs: Fugitive Amines", Microcontamination, pp. 37-40, Jun. 1993.

Cullins et al., "157-nm Photomask Handling and Infrastructure: Requirements and Feasibility", Proceedings of SPIE vol. 4409 (2001). pp. 632-640, Photomask and Next-Generation Lithography Mask Technology VIII: XP-002287329.

Kishkovich, Oleg, et al., "Airborne Molecular Contamination Control for DUV Lithography", Cleanroom Technology, vol. 6(5), pp. 31-33, Jun. 2000.

* cited by examiner

PHOTOMASK ASSEMBLY AND METHOD FOR PROTECTING THE SAME FROM CONTAMINANTS GENERATED DURING A LITHOGRAPHY PROCESS

RELATED APPLICATION

This application claims the benefit of U.S. Provisional Application Ser. No. 60/422,010 entitled "Photomask Assembly Including a Molecular Sieve and a Method for Preventing Contamination in a Lithography Environment," filed by Zhang et al. on Oct. 29, 2002.

TECHNICAL FIELD

The present invention is related in general to the field of photolithography and, more specifically, to a photomask assembly and a method for protecting the photomask assembly from contaminants generated during a lithography process.

BACKGROUND OF THE INVENTION

As semiconductor device manufacturers continue to produce smaller devices, the requirements for photomasks used in the fabrication of these devices continue to tighten. Photomasks, also known as reticles or masks, typically consist of substrates that have an absorber layer formed on the substrate. The absorber layer includes a pattern representing a circuit image that may be transferred onto semiconductor wafers in a lithography system. As feature sizes of semiconductor devices decrease, the corresponding circuit images on the photomask also become smaller and more complex. Consequently, the quality of the mask has become one of the most crucial elements in establishing a robust and reliable semiconductor fabrication process.

In order to maintain the quality of the photomask throughout its lifetime, manufacturers have developed a pellicle to protect at least the patterned side of the photomask from being damaged by contaminants that may be present in semiconductor manufacturing tools. The pellicle typically includes a thin film attached to a frame, which has a height that places the thin film outside of the focal plane such that contaminants on the film are not imaged onto a semiconductor wafer.

Photomask contamination, however, may still occur under the pellicle film during a photomask and/or semiconductor manufacturing process. Organic materials or chemicals used in during the manufacturing processes may interact with photons to create airborne molecular contaminants (AMCs). Additionally, AMCs may be created from an outgas of materials during a lithography process. Other sources of AMCs may include vaporized photoresist that is released during a photoresist coating process, evaporation of different chemicals during pre-bake and post-bake processes, and solvents used on the photomask in a developing process.

Contaminants, such as AMCs, may enter into the space between the pellicle film and the photomask through, for example, the vent hole in the pellicle frame. Additionally, AMCs, or other contaminants, may be trapped under the pellicle film after the pellicle is mounted on the photomask. The AMCs and other contaminants may create a haze in the optical path associated with the photomask assembly, which can reduce the clarity of the image in the focal plane. For example, a layer of contaminants may build up on the patterned side of a photomask, which may darken and distort an image projected onto a wafer.

The semiconductor industry currently implements many techniques to protect photomask assemblies and photomask manufacturing tools from fine particles that have sizes in the microns. AMCs, however, may have sizes in the Angstroms and the conventional techniques may not be effective for eliminating contamination. For example, a conventional particulate filter may have a pore diameter of approximately 0.3 microns that allows AMCs, which may be as small as ten Angstroms, to pass through the filter into the photomask assembly or lithography tool.

One conventional technique used to remove particulates includes a chemical filter placed in a pellicle frame. The material forming the chemical filter may bind with the particulate matter in a chemical reaction to form a new composition. The new composition, however, may become another source of contamination. Additionally, the chemical filter may reach a saturation limit and stop reacting with the particulate matter, at which point the chemical filter no longer prevents the particulate matter from contaminating the lithography tools.

Vent holes formed in the pellicle frame may also be an access point for particulate matter and AMCs to enter the area between the pellicle film and the photomask. Conventional techniques of preventing particles from passing through the vent hole include adding filter sheets in the vent hold to block contaminants from entering the space under the pellicle film. Typically, these filter sheets have pore sizes that block particulates in the range of approximately 0.5 μm or greater and molecular contaminants in the range of approximately 0.02 μm or greater. Thus, molecular contaminants that are smaller than 0.02 μm may pass through the conventional filter.

Additionally, the filter sheets may only block contaminants entering through the vent hole. A fabrication and/or cleaning process may leave chemical residue on the photomask or pellicle. The chemical residue may react with other chemicals during a manufacturing process. As a result, molecular contaminants may form between the pellicle film and the photomask without being exposed to the filter sheets in the vent hole, which can form a haze in the optical path associated with the photomask assembly.

SUMMARY OF THE INVENTION

In accordance with teachings of the present disclosure, disadvantages and problems associated with protecting a photomask assembly from contaminants generated during a lithography process have been substantially reduced or eliminated. In a particular embodiment, a photomask assembly includes a molecular sieve associated with a pellicle frame that prevents airborne molecular contaminants (AMCs) generated during a lithography process from contaminating the photomask.

In accordance with one embodiment of the present invention, a photomask assembly includes a pellicle assembly having a pellicle frame and a pellicle film coupled to a first surface of the pellicle frame. The pellicle frame further includes an inner wall and an outer wall. A second surface of the pellicle frame is coupled to a photomask opposite the pellicle film. A molecular sieve that prevents AMCs generated during a lithography process from contaminating the photomask is associated with the pellicle assembly.

In accordance with another embodiment of the present invention, a photomask assembly includes a pellicle assembly having a pellicle frame and a pellicle film coupled to a first surface of the pellicle frame. The pellicle frame further includes a vent aperture that allows a gas to pass therethrough formed in the pellicle frame between inner and outer walls. A second surface of the pellicle frame is coupled to a photomask opposite the pellicle film. The pellicle film, the photomask and the inner and outer walls of the pellicle frame define a protected space. A molecular sieve that prevents AMCs generated during a lithography process from contaminating the protected space is associated with the vent aperture.

In accordance with a further embodiment of the present invention, a method for protecting a photomask from contaminants generated during a lithography process includes providing a photomask assembly having a pellicle assembly coupled to a photomask. The pellicle assembly includes a pellicle film coupled to a first surface of a pellicle frame including an inner wall and an outer wall and a photomask coupled to a second surface of the pellicle frame opposite the pellicle film. A molecular sieve that prevents AMCs generated during a lithography process from contaminating the photomask is associated with the pellicle assembly.

Important technical advantages of certain embodiments of the present invention include a molecular sieve that eliminates contaminants from a contained area located in a lithography component. The molecular sieve includes a material that adsorbs, repels, decomposes and/or separates various contaminants. The material may include a pore size greater than an air molecule but less than the size of most contaminants, including AMCs having a minimum size of approximately ten Angstroms. Since the AMCs have a size greater than the pore size of the material forming the molecular sieve, the AMCs may be prevented from passing through the material.

Another important technical advantage of certain embodiments of the present invention includes a molecular sieve that prevents a haze from forming on a lithography component during a lithography process. The lithography process may include the use of numerous chemicals. If AMCs are trapped in a contained area associated with the lithography component, chemical reactions may occur between the chemicals and the AMCs. These chemical reactions may form a haze on a surface of the lithography component. By eliminating the AMCs from the defined space, chemical reactions may be reduced or even eliminated, which prevents the haze from forming in the lithography component.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the invention and its advantages are best understood by reference to FIGS. 1 through 6, where like numbers are used to indicate like and corresponding parts.

Figure 1:
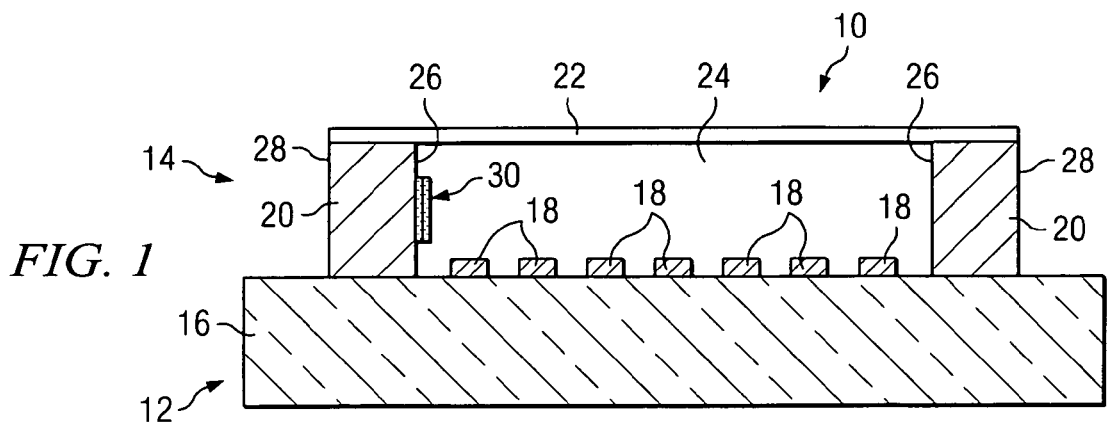
FIG. 1 illustrates a cross-sectional view of a photomask assembly including a molecular sieve associated with a pellicle frame according to teachings of the present invention.

FIG. 1 illustrates a cross-sectional view of photomask assembly 10 assembled in a pellicle mounting system. Photomask assembly 10 includes pellicle assembly 14 mounted on photomask 12 by the pellicle mounting system. Substrate 16 and patterned layer 18 form photomask 12, otherwise known as a mask or reticle, that may have a variety of sizes and shapes, including but not limited to, round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M-O—C—N), where the metal is selected from the group consisting of chromium, cobalt, iron, zinc, molybdenum, niobium, tantalum, titanium, tungsten, aluminum, magnesium and silicon, or any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VLV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Frame 20 may include inner walls 26 and outer walls 28 that, in combination with pellicle film 22 and photomask 12, define protected space 24. In one embodiment, protected space 24 may define an optical path when photomask assembly 10 is placed in a lithography system during a semiconductor manufacturing process.

Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Generally, molecular sieve 30 may function to eliminate AMCs from a contained area and therefore, prevent a haze from forming on one or more surfaces in the contained area. For example, molecular sieve 30 may adsorb, repel and/or decompose the AMCs such that the AMCs are prevented from collecting on the surfaces. Additionally, molecular sieve 30 may separate AMCs from gas molecules such that the gas molecules may pass through molecular sieve 30 and the AMCs are prevented from passing through molecular sieve 30.

Molecular sieve 30 may associate with lithography components, such as photomask assembly 10, or other components used in a lithography process. Components that molecular sieve 30 may associate with include photomask blanks, photomasks, pellicle assemblies, scanners, steppers, inspection/metrology equipment, cleaning equipment, packaging for the lithography components and any other equipment used in the lithography process. Molecular sieve 30 may be formed from a variety of different materials including, but not limited to, a surface adsorption material, a material formed to have a large surface area, a gas separation material and a catalytic material.

Molecular sieve 30 may be applied to inner wall 26 of frame 20, the inner walls of a lithography system (e.g., scanner, stepper, inspection/metrology equipment, cleaning equipment, etc.) or the inner walls of a photomask assembly carrier by attaching an ultra-thin membrane made from a specific material with an adhesive, double-sided sticky tape, screws, pins, clips and any other suitable means for attaching molecular sieve 30 to a surface. In another embodiment, molecular sieve 30 may be an ultra-thin membrane formed from specific materials that is incorporated into an adhesive to form a self-sticky membrane. In a further embodiment, molecular sieve 30 may be formed on the inner walls of a lithography system or the inner walls of a photomask assembly carrier as a coating that is applied using a deposition, an electroplating, a spraying or a crystallization technique. In some embodiments, molecular sieve 30 may be formed into different shapes including, but not limited to, beads, pellets, strips, films, gasket membranes or any combination of suitable shapes.

In one embodiment, molecular sieve 30 may be formed of a surface adsorption material that functions to absorb at least one type of airborne molecular contaminant (AMC), which may cause haze formation, deposition contamination growth and/or chemical reactions on the lithography components. The AMCs may be organic or inorganic and/or polar or non-polar contaminants (e.g., hydrocarbons, organosilicons, acid gases, ammonium ion gases, sulfate ion gases, oxide gases, siloxanes and fluorocarbons) generated during a lithography process. The lithography process may include, but is not limited to, a writing process, an etch process, a deposition process, a cleaning process and an exposure process. In other embodiments, molecular sieve 30 may further have the ability to absorb multiple types of AMCs created in a lithography process and may simultaneously prevent the creation of additional AMCs.

The adsorption material may additionally have a small pore size that prevents AMCs from passing through the material. The pore size may be smaller than the AMCs (e.g., approximately five to one-hundred Angstroms) but larger than air molecules (e.g., approximately four Angstroms for nitrogen and oxygen). Thus, any AMCs having a molecular size greater than five (5) Angstroms may be adsorbed by molecular sieve 30 and any smaller molecules (e.g., nitrogen and oxygen) may pass through the material.

Examples of adsorption materials may include metals, metal salts, and metal oxides, where the metals are selected from the group consisting of Group 3 metals, such as scandium, yttrium and lanthanum, Group 4 metals, such as titanium, zirconium and hafnium, vanadium, and Groups 8–15 metals, such as iron, copper, nickel and zinc. Other examples may include composite compounds such as high purity silica zeolite (e.g., silica aluminosilicates having a chemical composition including, but not limited to, one or more of MeO, $Al_2O_3$, $mSiO_2$, and $nH_2O$, where Me is a metal ion, m represents the molar ratio of $SiO_2$ and $Al_2O_3$ and may have a value between approximately 2 to approximately 1000, and n represents the water contained in the voids of a porous material and may have a value of a multiple of 8 between approximately 8 and approximately 24), zeolite (e.g. having a chemical composition including, but not limited to, one or more of MeO, $Al_2O_3$, $mSiO_2$, and $nH_2O$, where Me is a metal ion, m represents the molar ratio of $SiO_2$ and $Al_2O_3$ and may have a value between approximately 2 to approximately 1000, and n represents the water contained in the voids of a porous material and may have a value of a multiple of 8 between approximately 8 and approximately 24), synthetic zeolite, silica, silica oxide, silicon, and sol-gel processed materials. Further examples may include polymers and/or organic compounds such as carbon-based compounds, polymeric absorbents, cellulose based and/or kiln dried absorbents, and any other suitable material that may adsorb AMCs. As illustrated in Table 1, the surface adsorption materials may adsorb specific types of contaminants. Although Table 1 illustrates specific materials and contaminants, the table is merely illustrative and other surface adsorption materials and contaminants may be contemplated in the scope of the present invention.

TABLE 1

| Adsorption surface | Gaseous contaminant |
|---|---|
| Group 3 metals: scandium, yttrium and lanthanum. Group 4 metals: titanium, zirconium and hafnium; others: vanadium. Corresponding metal salts and oxides. | Hydrocarbon gases Water content |
| Silica zeolite (silica aluminosilicates: MeO.Al2O3. mSiO2.nH2O) or zeolite (MeO. Al2O3.mSiO2.nH2O) (Me: metal ion) | Hydrocarbon gases Water content |
| Group 10–14 metals: iron, copper, nickel and zinc. Corresponding metal salts and oxides. | Acid gases Oxide gases Siloxane |

In another embodiment, molecular sieve 30 may be formed of a catalytic material that initiates chemical reactions to decompose the AMCs into constituent components or smaller molecules. These smaller particles may be non-reactive in a lithography process using a specific exposure wavelength (e.g., below approximately 248 nanometers) and may not contribute to the formation of measurable contamination. For example, an organic AMC may partly be decomposed into oxygen molecules. These oxygen molecules may exist within protected space 24 without contaminating photomask assembly 10.

In one embodiment, the chemical reactions may be induced by exposure to ultra-violet radiation or heat, such as found in a lithography process. As a result, the catalytic material may decompose AMCs into smaller particles (e.g., individual atoms) rather than synthesize AMCs into other potential contaminants. In some embodiments, these smaller particles may be adsorbed by an adsorption material included in molecular sieve 30 such that the AMCs may be eliminated from protected space 24.

In one embodiment, the chemical reaction may refresh the catalyst and extend the life time of the catalytic material. Examples of catalytic material include, but are not limited to, porous titania, anatase titanium oxide, platinum, rhodium, palladium, iridium, osmium, silver and any other material suitable for providing a catalytic reaction with the AMCs.

In a further embodiment, molecular sieve 30 may be formed of a gas separation material that functions to separate AMCs from atmospheric air. The gas separation material may have specific permeability to air molecules, such as oxygen and nitrogen, but not to AMCs. Example gas separation materials include, but are not limited to, glassy polymeric membranes, partially carbonized asymmetric hollow fiber, polysilicone-carbonate copolymer membranes, fluoropolymer membranes, epoxysilicone coated membranes, copolyimide coated membranes and any other material suitable for separating AMCs from atmospheric air.

In an additional embodiment, molecular sieve 30 may be formed of a high surface area material that has a fine porosity such that molecular sieve provides sufficient surface area for efficient and complete chemisorption of the contaminants. Because most chemisorption and physisorption reactions are dependent on surface area, molecular sieve 30 formed of a high surface area material may reduce the amount of time that the material needs to interact with the AMCs. Additionally, molecular sieve 30 may be able to interact simultaneously with several types of AMCs due to the large surface area.

Examples of the high surface area material may include, but are not limited to, high purity silica zeolite, sol-gel silica, macroreticulate polymers, such as polymers formed from styrene, vinyltoluene and vinylisopropylbenze monomers and any other porous materials that provide a sufficient surface area for reactions to occur. Because the pore size of these materials may be small (e.g., a porosity of approximately five to approximately two-hundred Angstroms), the functional surface area, which is determined by the porosity, may be as large as approximately 40 to approximately 1000 $m^2/g$.

In some embodiments, the high surface area material may be a supporting and/or carrier material that provides a large number of pores for holding other materials. These materials may include, but are not limited to, adsorption materials, catalytic materials, gas separation materials and any combination thereof. In this case, the large surface area may provide sufficient reaction locations for adsorption, catalytic decomposition and separations reactions.

Figure 2:
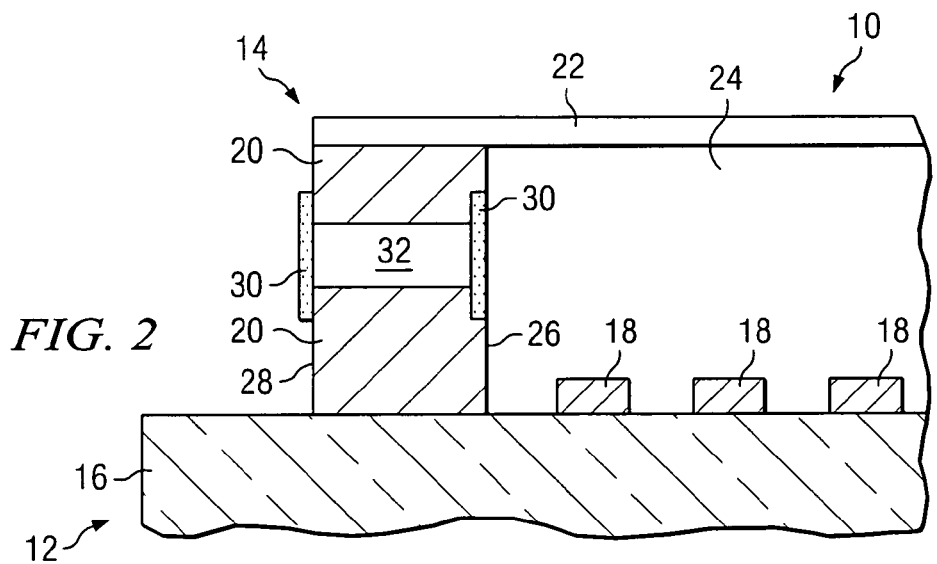
FIG. 2 illustrates a cross-sectional view in section of an example embodiment of a photomask assembly including at least one molecular sieve formed on an opening of a vent aperture according to teachings of the present invention.

FIG. 2 illustrates a cross-sectional view in section of an example embodiment of photomask assembly 10 with at least one molecular sieve formed on an opening of vent aperture 32. In some embodiments, vent aperture 32 may be included in pellicle frame 20 to allow for balancing pressure differentials that may occur between protected space 24 and the atmosphere surrounding photomask assembly 10.

Vent aperture 32 may be formed in pellicle frame 20 between inner walls 36 and outer walls 28 and may allow air or other gases to enter or exit protected space 24 of photomask assembly 10. In the illustrated embodiment, molecular sieve 30 may be formed on inner wall 26 over the inner opening of vent aperture 32 and on outer wall 28 over the outer opening of vent aperture 32 to prevent particulates or contaminants from entering defined space 24. In another embodiment, molecular sieve 30 may be formed on either inner wall 26 or outer wall 28. Molecular sieve 30 may be attached to and/or formed on inner wall 26 and outer wall 28 using any technique as described above in reference to FIG. 1.

In one embodiment, molecular sieve 30 on inner wall 26 may be formed from an adsorption material, a catalytic material, a gas separation material, a high surface area material or any combination thereof as described above in reference to FIG. 1. In another embodiment, molecular sieve 30 on outer wall 36 may be formed from a surface repellant material, a catalytic material, a gas separation material, a high surface area material or any combination thereof.

The surface repellant material may function to repel AMCs such that chemisorption and physisorption does not occur on the surface of molecular sieve 30. The surface of the repellant material may have a low energy such that the AMCs do not stick on the surface. Thus, the surface repellant material may further prevent AMCs from entering into protected space 24 of photomask assembly 10. In contrast to the surface adsorption material that may attract AMCs to the filter, the surface repellant material may have a "desorption" quality that deters reactions and prevents AMCs from entering into protected space 24.

Generally, surface repellent materials prevent AMCs from entering into protected space 24 from an outside environment. Nitrogen and oxygen molecules, however, that are smaller than the pore size of repellent material may pass through the material, which may provide for pressure release. Examples of surface repellent materials may include, but are not limited to, TEFLON® (manufactured and sold by E. I. du Pont de Nemours and Company), fluoropolymers, trifluoromethylated agents, tetrafluoroethylene plastics, fluoro-silicones, Z-dol coatings, fluorinated self-assembled monolayers, and coatings containing octadecyltrichlorosilane precursor molecules.

In one embodiment, molecular sieve 30 formed on outer wall 28 may combine a material having a large surface area with a repellent material to form a large surface area repellent material. Molecular sieve 30, therefore, may deter AMCs from entering protected space 24. Similarly, molecular sieve 30 formed on inner wall 26 may include a large surface area adsorption material to adsorb any AMCs that enter vent aperture 32 or to adsorb any AMCs present within defined space 24.

Figure 3:
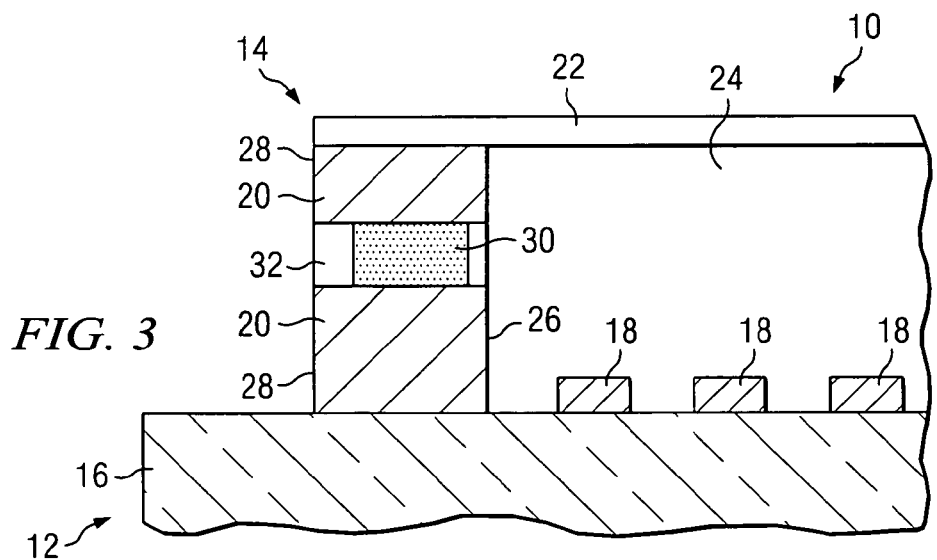
FIG. 3 illustrates a cross-sectional view in section of an example embodiment of a photomask assembly including a molecular sieve formed inside a vent aperture according to teachings of the present invention.

FIG. 3 illustrates a cross-sectional view in section of an example embodiment of photomask assembly 10 including molecular sieve 30 formed inside of vent aperture 32. Molecular sieve 30 may be placed inside of vent aperture 32 to prevent AMCs from entering into protected space 24 and contaminating photomask assembly 10.

Molecular sieve 30 may be formed of a surface adsorption material, a surface repellant material, a catalytic material, a gas separation material, a high surface area material or any combination thereof as describe above in reference to FIGS. 1 and 2. Molecular sieve 30 may be attached to the walls of vent aperture 32 using any technique as described above in reference to FIG. 1. Additionally, molecular sieve 30 may be a coating formed on the walls of vent aperture 32 that is applied using a deposition, an electroplating, a spraying or a crystallization technique. In some embodiments, molecular sieve 30 may be formed into different shapes including, but not limited to, beads, pellets, strips, films, gasket membranes or any other suitable shape.

Figure 4:
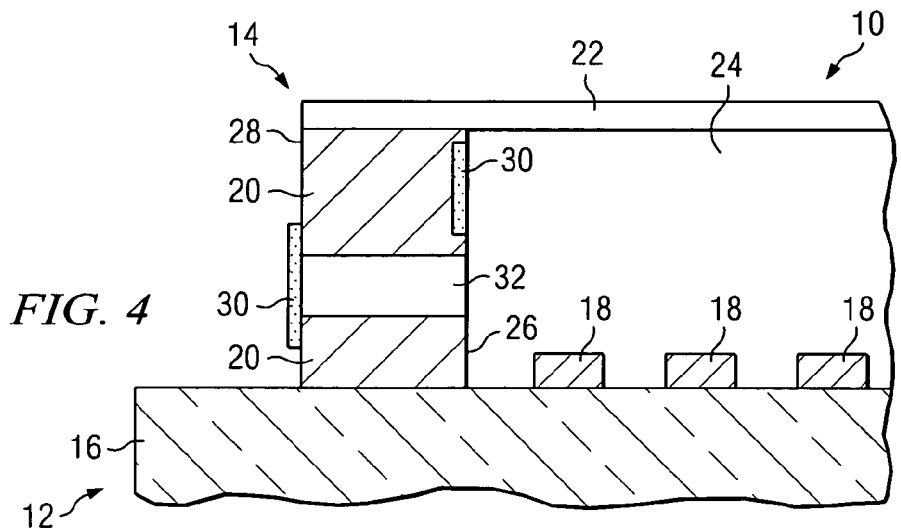
FIG. 4 illustrates a cross-sectional view in section of an example embodiment of a photomask assembly including a molecular sieve formed inside a groove in a pellicle frame according to teachings of the present invention.

FIG. 4 illustrates a cross-sectional view in section of an example embodiment of photomask assembly 10 including molecular sieve formed in a grove in pellicle frame 20. In the illustrated embodiment, a grove may be formed near inner wall 26 of pellicle frame 20. Molecular sieve 30 may be placed in the grove in order to prevent any AMCs trapped in protected space 24 from contaminating photomask assembly 10. Additionally, molecular sieve 30 may be formed on outer wall 28 over an outer opening of vent aperture 32. The molecular sieve over the opening may function to prevent AMCs from entering protected space 32 through vent aperture 32. In other embodiments, a grove containing molecular sieve 30 may be formed near outer wall 28 of frame 20 in order to prevent AMCs from passing through vent aperture 32. Additionally, a grove may be formed near both inner and outer walls 26 and 28 in which molecular sieve 30 may be placed.

Molecular sieve 30 may be formed of a surface adsorption material, a surface repellant material, a catalytic material, a gas separation material, a high surface area material or any combination thereof as described above in reference to FIGS. 1 and 2. Molecular sieve 30 may be attached to the walls of vent aperture 32 using any technique as described above in reference to FIG. 1. Additionally, molecular sieve 30 may be a coating formed on the walls of the grove that is applied using a deposition, an electroplating, a spraying or a crystallization technique. In some embodiments, molecular sieve 30 may be formed into different shapes including, but not limited to, beads, pellets, strips, films, gasket membranes or any other suitable shape.

Figure 5:
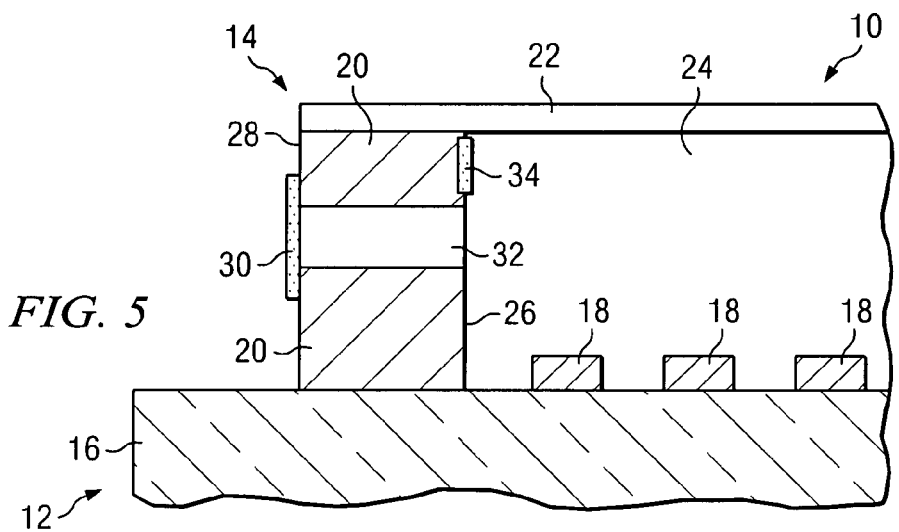
FIG. 5 illustrates a cross-sectional view in section of an example embodiment of a photomask assembly including a coating formed on an inner wall of a pellicle frame according to teachings of the present invention.

FIG. 5 illustrates a cross-sectional view in section of an example embodiment of photomask assembly 10 including a coating applied to inner wall 26 of frame 20. In the illustrated embodiment, coating 34 may be applied to inner wall 26 to eliminate AMCs trapped in protected space 24 and prevent contamination from forming on photomask 12 and/or pellicle assembly 14. Additionally, molecular sieve 30 may be formed on outer wall 28 over vent aperture 32 to prevent AMCs from passing through vent aperture 32.

Coating 34 may be formed of a surface adsorption material, a catalytic material, a gas separation material, a high surface area material or any combination thereof as described above in reference to FIG. 1. In one embodiment, coating 34 may be applied on inner wall 26 using a deposition, an electroplating, a spraying or a crystallization technique. Molecular sieve 30 may be formed of a surface repellant material, a catalytic material, a gas separation material, a high surface area material or any combination thereof as described above in reference to FIG. 2. Molecular sieve 30 may be attached to outer wall 28 of frame 20 using any technique as described above in reference to FIG. 1. In some embodiments, molecular sieve 30 may be formed into different shapes including, but not limited to, beads, pellets, strips, films, gasket membranes or any other suitable shape.

Figure 6:
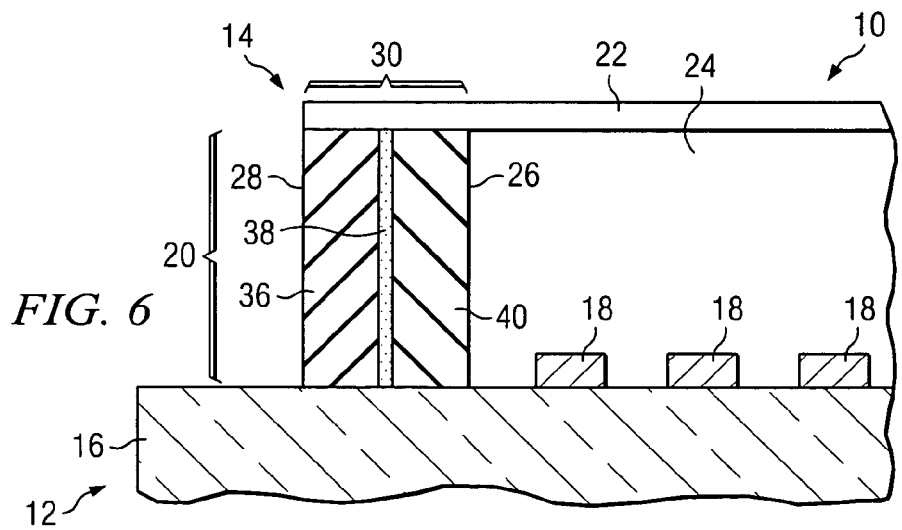
FIG. 6 illustrates a cross-sectional view in section of an example embodiment of a photomask assembly including a molecular sieve forming a part of a pellicle frame according to teachings of the present invention.

FIG. 6 illustrates a cross-sectional view in section of an example embodiment of photomask assembly 10 with frame 20 formed from molecular sieve 30 including repellent layer 36, gas separation layer 38 and adsorption layer 40. In one embodiment, molecular sieve 30 may form all of frame 20. In other embodiments, molecular sieve 30 may form a part of frame 20 such that the remainder of frame 20 is formed from materials described in reference to FIG. 1. In these examples, molecular sieve 30 may be formed using processes including, but not limited to, sintering, extrusion, casting, press-forming and any other suitable process used to form frame 20 from molecular sieve 30.

In the illustrated embodiment, molecular sieve 30 may include repellent layer 36 that forms at least a portion of outer wall 28. Adsorption layer 40 may form at least a portion of inner wall 26 and gas separation layer 38 may be placed between repellent layer 36 and adsorption layer 40 to act as a barrier to prevent AMCs from contaminating photomask assembly 10. Additionally, gas separation layer 38 may act as an insulator between air surrounding photomask assembly 10 and air inside protected space 24.

In certain embodiments, molecular sieve 30 may combine a material having a large surface area with adsorption layer 36, gas separation layer 38 and/or repellent material 40. Molecular sieve 30 may have a pore size of approximately ten (10) Angstroms. Because the molecular size of nitrogen and oxygen is approximately four (4) Angstroms, nitrogen and oxygen molecules may pass through the high surface area material. The AMCs, however, may have a molecule size greater than approximately ten (10) Angstroms and may be trapped by the high surface area material. Thus, the high surface material may also function as a selective gas barrier to prevent contaminants from entering protected space 24. In one embodiment, molecular sieve 30 may provide a pressure balance between protected space 24 and the air surrounding photomask assembly 10 without the need for vent aperture 32.

In some embodiments, molecular sieve 30 may be applied as a coating on some or all of the entire surface of lithography component. Additionally, molecular sieve 30 may be associated with lithography components using a variety of fabrication processes such as sintering, extrusion, sol-gel processing, crystallization, polymerization, and other fabrication processes suitable for associating molecular sieve 30 with lithography tools.

Although the present invention and its advantages have been described in detail, it should be understood that various changes, substitutions and alternations can be made herein without departing from the spirit and scope of the invention as defined by the following claims.

What is claimed is:

1. A photomask assembly, comprising:
   a pellicle assembly including a pellicle frame and a pellicle film coupled to a first surface of the pellicle frame, the pellicle frame including an inner wall and an outer wall;
   a photomask coupled to a second surface of the pellicle frame opposite the pellicle film; and
   a molecular sieve associated with the pellicle assembly, the molecular sieve operable to prevent airborne molecular contaminants (AMCs) generated during a lithography process from contaminating the photomask.

2. The photomask assembly of claim 1, further comprising the molecular sieve formed on an inner wall of the pellicle frame.

3. The photomask assembly of claim 2, further comprising the molecular sieve formed of a surface adsorption material operable to absorb the AMCs without generating other contaminants.

4. The photomask assembly of claim 3, further comprising the surface adsorption material selected from the group consisting of metals, metal salts, metal oxides, composite compounds, polymers and organic compounds.

5. The photomask assembly of claim 1, further comprising the molecular sieve formed of a catalytic material operable to decompose the AMCs into smaller particles.

6. The photomask assembly of claim 5, further comprising the catalytic material selected from the group consisting of porous titania, anatase titanium oxide, platinum, rhodium, palladium, iridium, osmium and silver.

7. The photomask assembly of claim 1, further comprising the molecular sieve formed of a gas separation material operable to allow a gas to pass therethrough and prevent the AMCs from contaminating the photomask.

8. The photomask assembly of claim 7, further comprising the gas separation material selected from the group consisting of glassy polymeric membranes, partially carbonized asymmetric hollow fibers, polysilicone-carbonate copolymer membranes, fluoropolymer membranes, epoxy-silicone coated membranes and copolyimide coated membranes.

9. The photomask assembly of claim 1, further comprising the molecular sieve formed of a high surface area material including a plurality of pores, the pores operable to hold a filter material selected from the group consisting of a surface adsorption material, a catalytic material and a gas separation material.

10. The photomask assembly of claim 9, wherein the pores comprise a size between approximately five Angstroms and approximately two-hundred Angstroms.

11. The photomask assembly of claim 9, further comprising the high surface area material selected from the group consisting of high purity silica zeolite, sol-gel silica and macroreticulate polymers.

12. The photomask assembly of claim 1, further comprising:
   a protected space defined by an area between the pellicle film, the photomask and the inner and outer walls of the pellicle frame;
   a vent aperture formed in the pellicle frame between the inner and outer walls, the vent aperture operable to allow a gas to pass therethrough; and
   the molecular sieve associated with the vent aperture and operable to prevent AMCs from entering into the protected space during the lithography process.

13. The photomask assembly of claim 12, further comprising the molecular sieve formed on an outer wall of the pellicle frame adjacent an outer opening of the vent aperture.

14. The photomask assembly of claim 13, further comprising the molecular sieve formed of a surface repellant material operable to prevent the AMCs from entering into the protected area.

15. The photomask assembly of claim 14, further comprising the surface repellant material selected from a group consisting of fluoropolymers, trifluoromethylated agents, tetrafluoroethylene plastics, fluoro-silicones, Z-dol coatings, fluorinated self-assembled monolayers and coatings including octadecyltrichlorosilane precursor molecules.

16. The photomask assembly of claim 12, further comprising the molecular sieve formed in the vent aperture.

17. The photomask assembly of claim 1, further comprising the molecular sieve formed in a grove located in the pellicle frame.

18. A photomask assembly, comprising:
   a pellicle assembly including a pellicle frame and a pellicle film coupled to a first surface of the pellicle frame, the pellicle frame including an inner wall and an outer wall;
   a vent aperture formed in the pellicle frame between the inner and outer walls, the vent aperture operable to allow a gas to pass therethrough;
   a photomask coupled to a second surface of the pellicle frame opposite the pellicle film;

a protected space defined by an area between the pellicle film, the photomask and the inner and outer walls of the pellicle frame; and a molecular sieve associated with the vent aperture, the molecular sieve operable to prevent airborne molecular contaminants (AMCs) generated during a lithography process from contaminating the protected space.

19. The photomask assembly of claim 18, further comprising the molecular sieve formed on an inner wall of the pellicle frame adjacent an inner opening of the vent aperture.

20. The photomask assembly of claim 19, further comprising the molecular sieve formed of a surface adsorption material operable to absorb the AMCs without generating other contaminants.

21. The photomask assembly of claim 18, further comprising the molecular sieve formed on an outer wall of the pellicle frame adjacent an outer opening of the vent aperture.

22. The photomask assembly of claim 21, further comprising the molecular sieve formed of a surface repellant material operable to prevent the AMCs from entering into the protected space.

23. The photomask assembly of claim 18, further comprising the molecular sieve formed of a catalytic material operable to decompose the AMCs into smaller particles.

24. The photomask assembly of claim 18, further comprising the molecular sieve formed of a gas separation material operable to allow a gas to pass therethrough and prevent the AMCs from contaminating the protected space.

25. The photomask assembly of claim 18, further comprising the molecular sieve formed of a high surface area material including a plurality of pores, the pores operable to hold a filter material selected from the group consisting of a surface adsorption material, surface repellant material, a catalytic material and a gas separation material.

26. The photomask assembly of claim 25, wherein the pores comprise a size between approximately five Angstroms and approximately two-hundred Angstroms.

27. The photomask assembly of claim 18, further comprising the molecular sieve formed in the vent aperture.

28. A method for protecting a photomask from contaminants generated during a lithography process, comprising:

providing a photomask assembly including a pellicle assembly coupled to a photomask, the pellicle assembly comprising:

a pellicle film coupled to a first surface of a pellicle frame including an inner wall and an outer wall; and a second surface of the pellicle frame coupled to the photomask opposite the pellicle film; and associating a molecular sieve with the pellicle assembly, the molecular sieve operable to prevent airborne molecular contaminants (AMCs) generated during a lithography process from contaminating the photomask.

29. The method of claim 28, wherein the molecular sieve comprises at least one material, the at least one material selected from the group consisting a surface adsorbent material, a surface repellant materiel, a catalytic material, a gas separation material and a high surface area material.

30. The method of claim 28, wherein the associating step comprises forming the pellicle frame in part from the molecular sieve.

31. The method of claim 28, wherein the associating step comprises coating at least a portion of the pellicle assembly with the molecular sieve.

32. The method of claim 28, wherein the associating step comprises attaching the molecular sieve to the pellicle assembly.

33. The method of claim 28, further comprising:

forming a vent aperture between the inner and outer walls of the pellicle fame, the vent aperture operable to allow a gas to pass therethrough; and associating the molecular sieve with the vent aperture.

34. The method of claim 33, wherein the associating step comprises attaching the molecular sieve to at least one of the outer and inner walls of the pellicle frame.

* * * * *